United States Patent [19]

Rankin et al.

[11] Patent Number: 5,057,848
[45] Date of Patent: Oct. 15, 1991

[54] BROADBAND FREQUENCY METER PROBE
[75] Inventors: William J. Rankin, Burnsville, Minn.; Reed E. Holaday, Tuscon, Ariz.
[73] Assignee: Holaday Industries, Inc., Minneapolis, Minn.
[21] Appl. No.: 358,681
[22] Filed: May 30, 1989
[51] Int. Cl.$^5$ .................. G01R 31/020; H01Q 21/290; H01Q 21/300; H04B 17/000
[52] U.S. Cl. .................................... 343/703; 343/725; 343/739; 324/72.5; 324/140 R; 455/67
[58] Field of Search ................ 343/700 MS, 703, 729, 343/846, 739, 829, 725, 749, 752, 826, 722, 751; 324/72, 72.5, 140 R, 457, 458; 455/67

[56] References Cited
U.S. PATENT DOCUMENTS

| | | | |
|---|---|---|---|
| D. 221,587 | 8/1971 | Aslan | D52/6 |
| 3,662,260 | 5/1972 | Thomas et al. | 324/72 |
| 3,750,017 | 7/1973 | Bowman et al. | 324/72 |
| 3,889,185 | 6/1975 | Wojtasinski et al. | 324/72 |
| 3,931,573 | 1/1976 | Hopfer | 324/106 |
| 4,023,093 | 5/1977 | Aslan | 324/43 R |
| 4,023,408 | 5/1977 | Ryan et al. | 324/72 |
| 4,050,072 | 9/1977 | Nyhus | 343/121 |
| 4,083,050 | 4/1978 | Hall | 343/725 |
| 4,089,003 | 5/1978 | Conroy | 343/700 MS |
| 4,091,327 | 5/1978 | Larsen et al. | 324/95 |
| 4,097,860 | 6/1978 | Araseki et al. | 340/347 CC |
| 4,109,199 | 8/1978 | Ball et al. | 324/202 |
| 4,198,677 | 4/1980 | Brunner et al. | 364/571 |
| 4,200,934 | 4/1980 | Hofmann | 364/571 |
| 4,201,989 | 5/1980 | Czerwinski | 343/715 |
| 4,272,719 | 6/1981 | Niki et al. | 324/72 |
| 4,313,121 | 1/1982 | Campbell et al. | 343/790 |
| 4,328,501 | 5/1982 | DeSantis et al. | 343/749 |
| 4,365,192 | 12/1982 | Rankin et al. | 324/72 |
| 4,513,290 | 4/1985 | Lefevre et al. | 343/745 |
| 4,634,968 | 1/1987 | Aslan | 324/95 |
| 4,642,558 | 2/1987 | Batchman et al. | 324/72.5 |
| 4,644,361 | 2/1987 | Yokoyoma | 343/700 MS |
| 4,658,266 | 4/1987 | Doty, Jr. | 343/848 |
| 4,691,209 | 9/1987 | Kershaw | 343/729 |
| 4,697,190 | 9/1987 | Oswald | 343/719 |
| 4,806,851 | 2/1989 | Krioer et al. | 324/72 |

OTHER PUBLICATIONS

AdHoc Group Contribution to P1140 for IEEE Standard Procedures for Measurement of Emissions of Electrical and Magnetic Field from VDT's from 5 Hz to 400 kHz, S. A. Roberts, 2/8/91, pp. cover, 3-5, 14, 15.
Unauth. Translation of Swedish Standard SS 436 14 90 entitled: Computers and Office Machines—Measuring Methods for Electrical and Magnetic Near Fields, 2/90.
Data Sheets for Equipment from IFI: EFS-5.
Data Sheets for Equipment from IFI: EFS-1 E-Field Sensor.
Data Sheets for Equipment from IFI: LPA-2 Leveling Preamplifier.
Data Sheets for Equipment from IFI: LMT-LDI.
Model EFS-1 Field Strength Meter Calibration Procedure.
EFS-1 Operator Instructions.
Instruments for Industry, Inc. Radiation Hazard Monitor Preliminary Operating Instructions and Description.
Proceedings 40th Annual Broadcast Engineering Conference, National Association of Broadcasters, Dallas, Tex., 1986, Paper entitle, "Real-Time Data Averaging for Determining Human RF Exposure", by Richard A. Tell.
Broadband Exposure Hazard Monitor Model HI-3500.
NIOSH Report of Mar. 14, 1986, entitled, "Measurement and Analysis of Electromagnetic Field Emissions from 24 Video Display Terminals in American Telephone and Telegraph Office, Washington, D.C.", by Arthur W. Guy.

Primary Examiner—Rolf Hille
Assistant Examiner—Peter Toby Brown
Attorney, Agent, or Firm—Faegre & Benson

[57] ABSTRACT

A broadband frequency meter probe utilizes a high frequency antenna and a low frequency antenna to sense wideband electromagnetic energy wherein the different frequency band antennas are closely based monopole and disk antennas. A three-dimensional probe is disclosed having three mutually orthogonal antenna pairs. Damping is provided to decouple resonance which would otherwise occur between the monopole and disk antenna. Self-checking for sensing operation of associated electronics and for providing an indication of normal and abnormal operating conditions is included.

20 Claims, 14 Drawing Sheets

POWER SUPPLY

BROADBAND FREQUENCY METER PROBE

BACKGROUND OF THE INVENTION

In the past, electric field measuring instruments have been limited in frequency response. This is due, in part, to the limited frequency response of antennas used with such meters. In addition, such prior art meters have used relatively cumbersome techniques to achieve a wide sensitivity range to be able to measure a relatively wide range of field strengths. One such prior art system requires selection of one from a plurality of antennas which is inserted into the meter manually before readings are taken.

The present system overcomes the disadvantages of the prior art by providing a broadband frequency meter probe which simultaneously utilizes a plurality of antennas to sense both low and high frequency regions in the range of frequencies to be measured. A wide dynamic range of field strengths is achieved through the use of a programmable gain amplifier which can be electronically and automatically switched to one of a plurality of predetermined gains. The probe of the present invention is capable of operating under control of a remote meter to sense and return field strength readings to the meter.

A variety of self-checking circuits help insure proper operation of the broadband meter probe of this invention.

DETAILED DESCRIPTION

Figure 1:
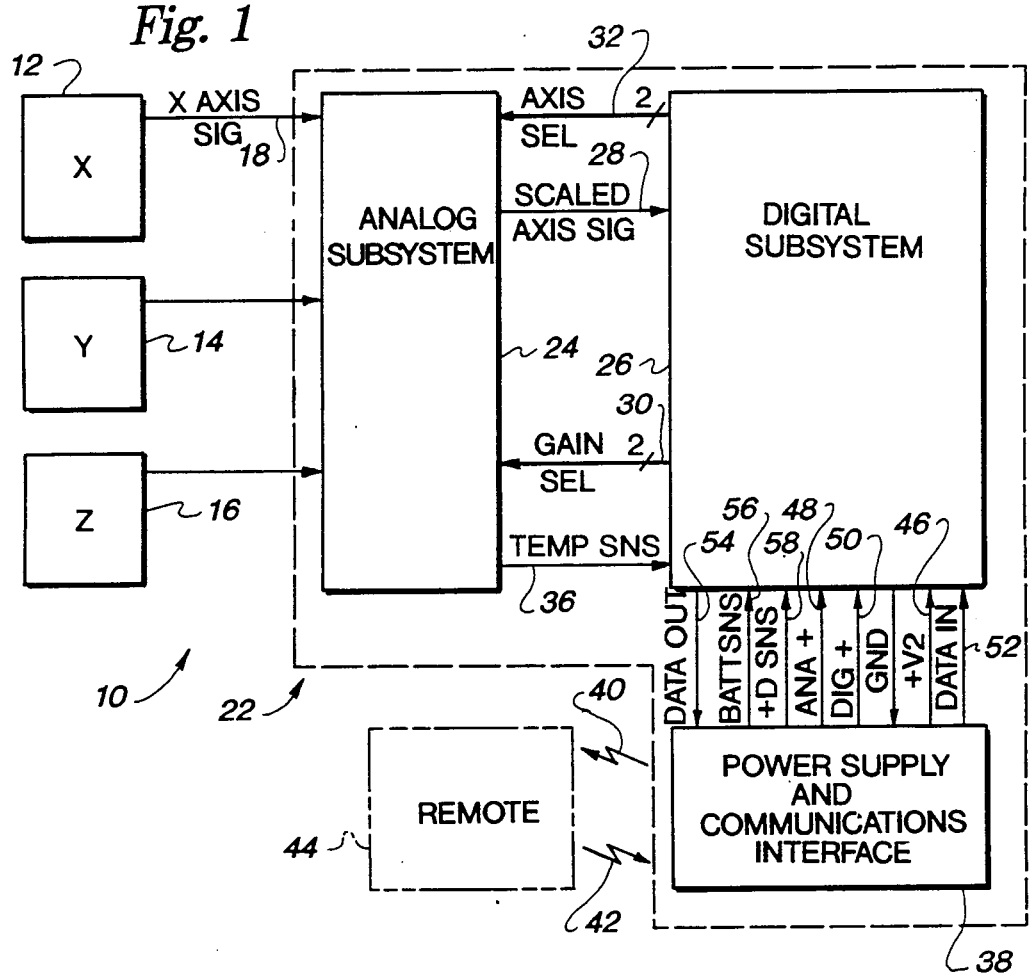
FIG. 1 is a block diagram of the broadband meter and probe system of the present invention.

Referring now to FIG. 1, a block diagram of the broadband meter probe system 10 may be seen. System 10 illustrates an isotropic or position independent system having three antenna subsystems oriented along mutually orthogonal axes (which may be seen more clearly in FIG. 12) labeled X, Y and Z. Although an isotropic system is shown, it is to be understood that certain aspects of the present invention are not so limited and may be practiced with a non-isotropic system in which only one or two antenna subsystems need be utilized. Nevertheless, this description will refer to and describe the isotropic embodiment which includes three antenna subsystems, 12, 14, 16 which are preferably identical except in their spatial orientation. X antenna subsystem 12 preferably has an X AXIS signal output 18. These outputs and the corresponding outputs from antenna subsystems 14 and 16 are received by a signal processing means 22, which in a preferred embodiment includes an analog subsystem 24, a digital subsystem 26 and a power supply and communication interface 38. Analog subsystem 24 provides a scaled axis signal 28 to digital subsystem 26 with a scale factor or gain controlled by a GAIN SELECT signal 30. In an isotropic measuring system, the axis of signal 28 is determined by an AXIS SELECT signal 32 in a time-multiplexed manner. Analog subsystem 24 may also provide a TEMPERATURE SENSE signal 36 to digital subsystem 26. The power supply and communications interface 38 provides for fiber optic communications signals 40, 42 to and from a remote system or equipment 44 and also provides a switched power supply 46, and precision analog and digital power supplies 48, 50. Data received on optical link 42 is converted to a DATA-IN electrical signal 52, while a DATA-OUT electrical signal 54 is converted by interface 38 into optical link 40. Interface 38 also preferably provides a BATTERY SENSE signal 56 and a DIGITAL SENSE signal 58 for a digital power supply.

Figure 2:
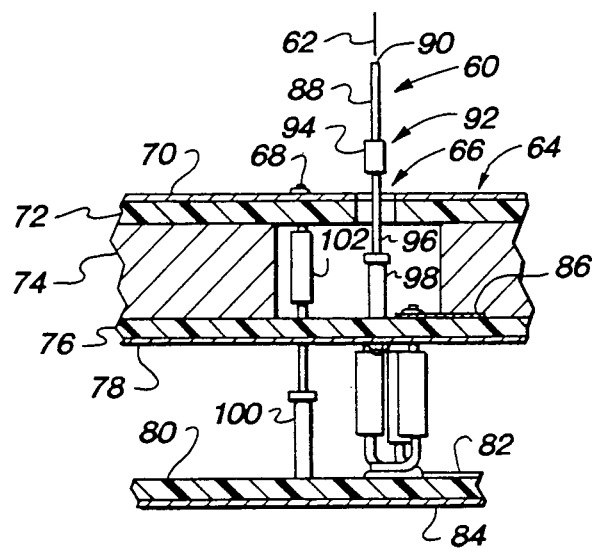
FIG. 2 is a fragmentary cross-section view showing details of the antennas and associated electrical connections and components of the probe of the present invention.

Referring now more particularly to FIG. 2, certain mechanical details of the present invention may be seen. A monopole antenna 60 is oriented to lie along a principal axis 62. Principal axis 62 is centered on and perpendicular to a circular disk antenna 64. An aperture 66 is centered on axis 62 to allow for projection of antenna 60 therethrough. Because of the presence of monopole antenna 60, an electrical connection 68 is made to disk antenna 64 eccentric of principal axis 62 and aperture 66. Antenna 64 may be formed from printed circuit foil material 70 bonded to a printed circuit board substrate 72. Spacer material 74 and printed circuit board 76 cooperate with printed circuit board 72 to space antenna 64 from its respective ground plane 78, which may be formed in the same manner as foil 70.

A third printed circuit board 80 has, preferably, a component foil layer 82 and a ground plane foil layer 84. Ground plane 84 is preferably imperforate to form a radio frequency barrier to prevent any surrounding electric field from passing plane 84. This will prevent adverse radio frequency effects on subsequent circuitry. A component layer 86 may or may not be provided on printed circuit board 76, as desired. Monopole antenna 60 is preferably formed of a resistive portion 88 extending from a free end 90 to a mediate region 92 of antenna 60. Resistive portion 88 may be formed of a 0.030 inch diameter filament of carbon-loaded teflon as manufactured by Polymer Corp., 2120 Fairmont Avenue, Reading, Pa., 19603. A splice or crimp 94 joins resistive portion 88 to a conductive portion 96. Conductive portion 96 is preferably received in a socket 98, which connection is preferably formed of gold plated materials to provide a high quality connection. Resistive portion 88 is preferably two centimeters long, while the conductive portion 96 projecting above foil 70 is preferably one centimeter in length. The spacing from foil 70 to foil 78 is preferably 0.3125 inches. It is to be understood that the dielectric constant of printed circuit boards 72 and 76 and spacer 74 are preferably relatively constant with respect to temperature, humidity and other environmental parameters.

Disk antenna 64 is preferably two inches in inch diameter, with a 0.250 inch diameter aperture 66. A second pin connector 100 preferably connects antenna 64 to component layer foil 82 through a resistor 102. It is to be understood that this antenna 64 functions as a displacement current antenna for sensing relatively low frequency portions of a surrounding electric field while monopole antenna 60 senses relatively higher frequency portions of the surrounding electric field with both the displacement current antenna and the monopole antenna located adjacent each other as shown in FIG. 2 such that they sense the same spatial component of the surrounding electric field.

Figure 3:
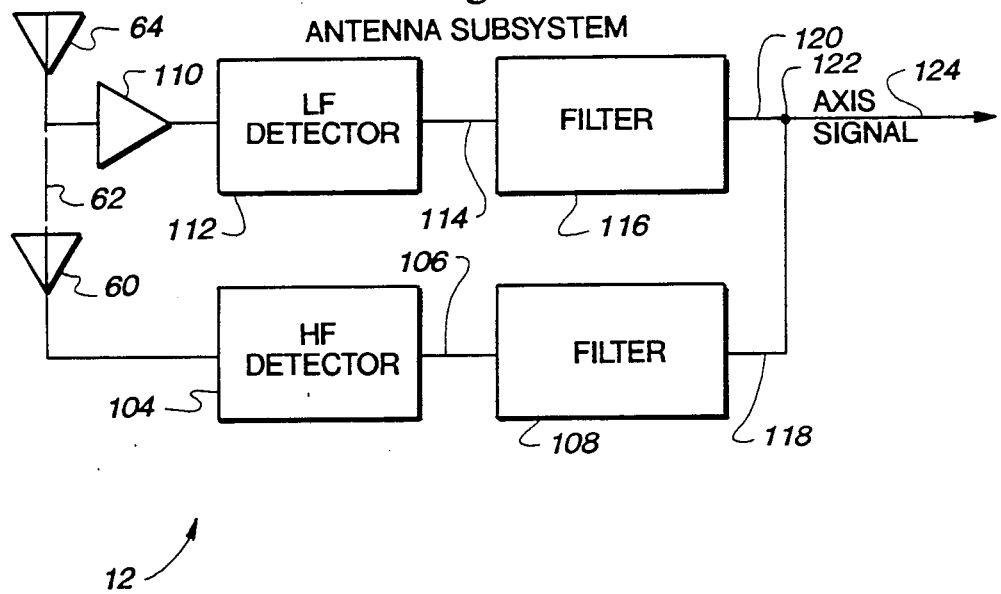
FIG. 3 is a block diagram of the antenna subsystem of the present invention.

Referring now more particularly to FIG. 3, a more detailed block diagram of antenna subsystem 12 may be seen. In the antenna subsystem 12, high frequency antenna 60 is connected to a high frequency detector or demodulator 104. The output 106 of detector 104 is passed through a low pass filter 108. Low frequency antenna 64 is connected to an amplifier 110 which in turn drives a low frequency detector 112 whose outpyut 114 is passed through a low pass filter 116. Preferably detectors 104 and 112 are identical, as are filters 108 and 116. Output 118 and 120 are combined at junction 122 to provide an axis signal 124.

Figure 4:
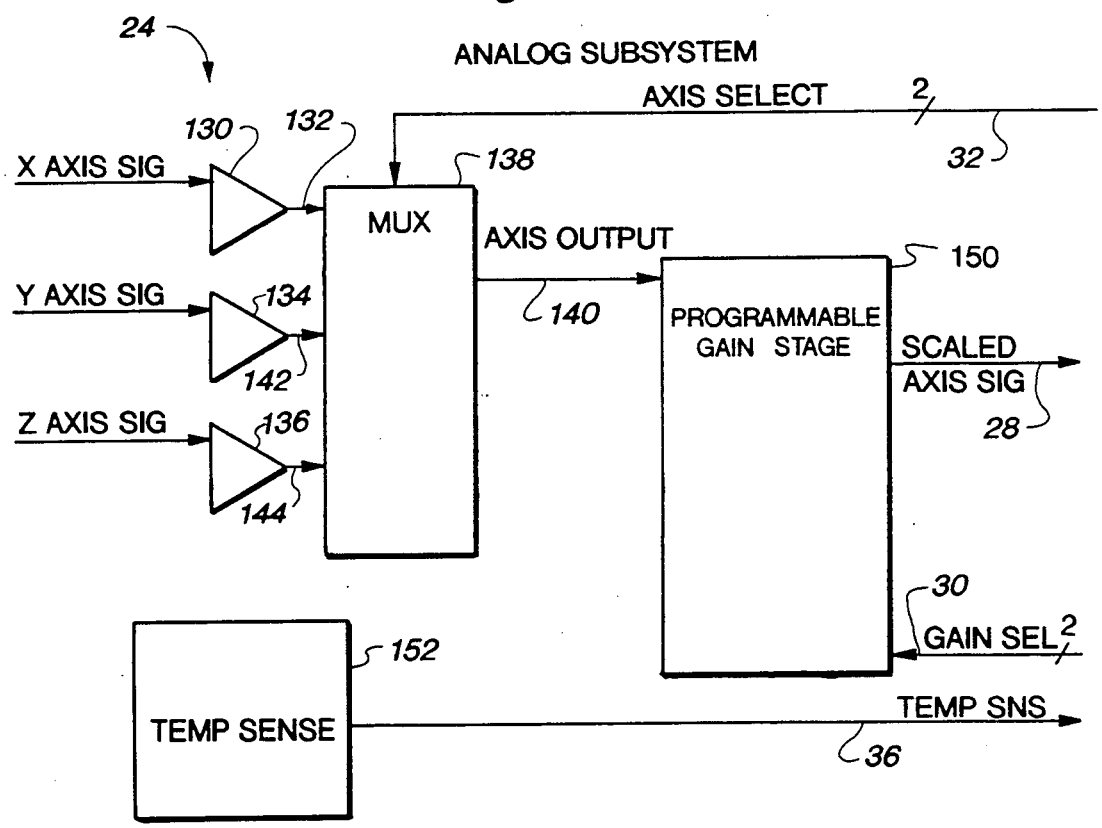
FIG. 4 is a block diagram of the analog subsystem of the present invention.

Referring now to FIG. 4, a more detailed block diagram of the analog subsystem 24 may be seen. The AXIS signal 124 is provided to the inverting input of an amplifier 130. The output 132 of amplifier 130 will thus have the AXIS signal present. Amplifiers 134 and 136 are provided for the Y and Z AXIS signals, respectively. A multiplexer 138 will operate under control of the two-bit wide AXIS SELECT signal 32 to select one of the axis amplifier output signals 132, 142, 144 presented it as an AXIS OUTPUT signal 140. A programmable gain stage 150 receives AXIS OUTPUT signal 140. In the embodiment disclosed, stage 150 is responsive to the GAIN SELECT signal 30 (which is also preferably a parallel digital signal) to provide a plurality of amplification factors for the SCALED AXIS signal 28. In a preferred embodiment, GAIN SELECT signal 30 is preferably two bits wide, permitting four possible amplification or gain factors.

TEMPERATURE SENSE signal 36 is provided by a temperature sense circuit 152 which provides ambient temperature information to digital subsystem 26 which may be used to correct temperature effects in the axis signals.

Figure 5:
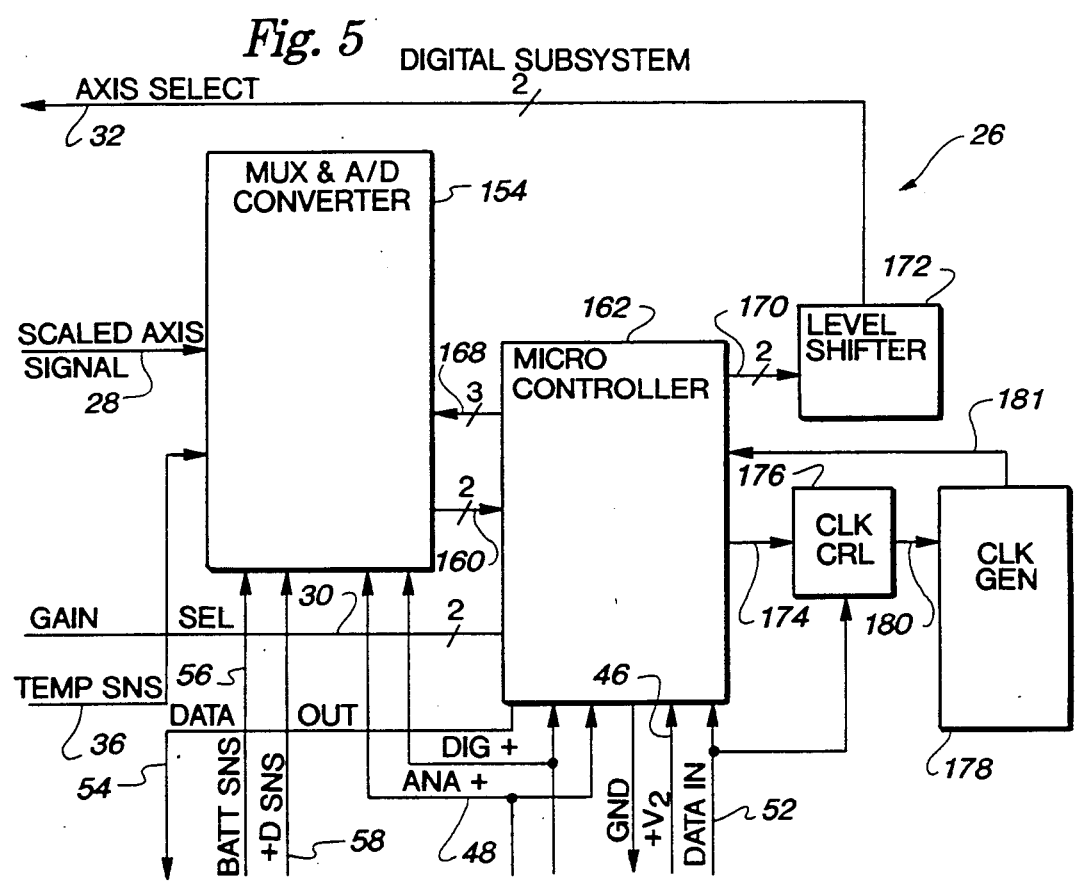
FIG. 5 is a block diagram of the digital subsystem of the present invention.

Referring now more particularly to FIG. 5, the SCALED AXIS signal 28 is provided to a multiplexer and A to D converter 154. Multiplexer and converter 154 receives the TEMPERATURE SENSE signal 36, the BATTERY SENSE signal 56, a DIGITAL SENSE signal 58 and the regulated analog voltage 48 (as a signal) at its inputs. These inputs are multiplexed and converted from analog to digital format and provided on an output line 160 in serial form. Output line 160 is connected to a microcontroller 162 which delivers a digital representation of the electric field as the DATA-OUT signal 54. It is to be understood that the DATA-OUT signal 54 may represent individual axial components of the electric field or alternatively or additionally may represent the RMS value of the X, Y and Z components combined. Furthermore, because the surrounding electric field may be time-varying, DATA-OUT signal 54 may be a digitally filtered representation, accomplished by microcontroller 162. Electric signal 54 is preferably delivered to a fiber optic transmitter 164 (see FIG. 6) for conversion to fiber optic signal 40 for transmission to remote system 44. Fiber optic signal 42 is, similarly, received by a fiber optic receiver 166 from remote system 44. Receiver 166 converts optical signal 42 into the DATA-IN electrical signal 52 for use by microcontroller 162 and other circuitry of system 10.

Microcontroller 162 provides clock and address signals 168 to multiplexer and converter 154. Microcontroller 162 also provides a two-bit wide AXIS SELECT signal 170 which is increased in magnitude by a level shifter 172 to provide AXIS SELECT signal 32 compatible with multiplexer 138.

Microcontroller 162 also provides a command signal 174 to a clock control circuit 176 which controls a clock generator 178 through an on-off control signal 180. When commanded on, generator 178 provides a clock pulse train signal 181 to controller 162. Clock control circuit 176 also receives DATA-IN signal 52.

Figure 6:
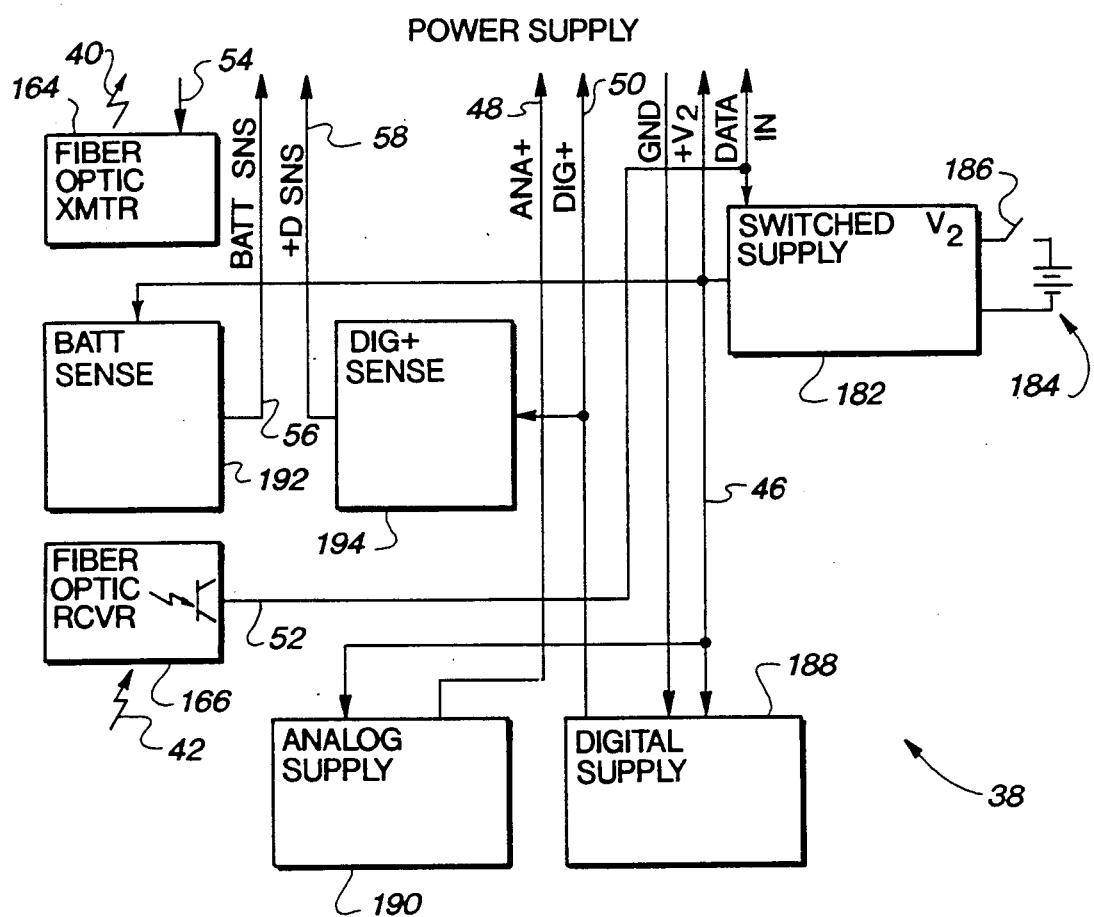
FIG. 6 is a block diagram of the power supply and communication interface of the probe of the present invention.
Figure 7:
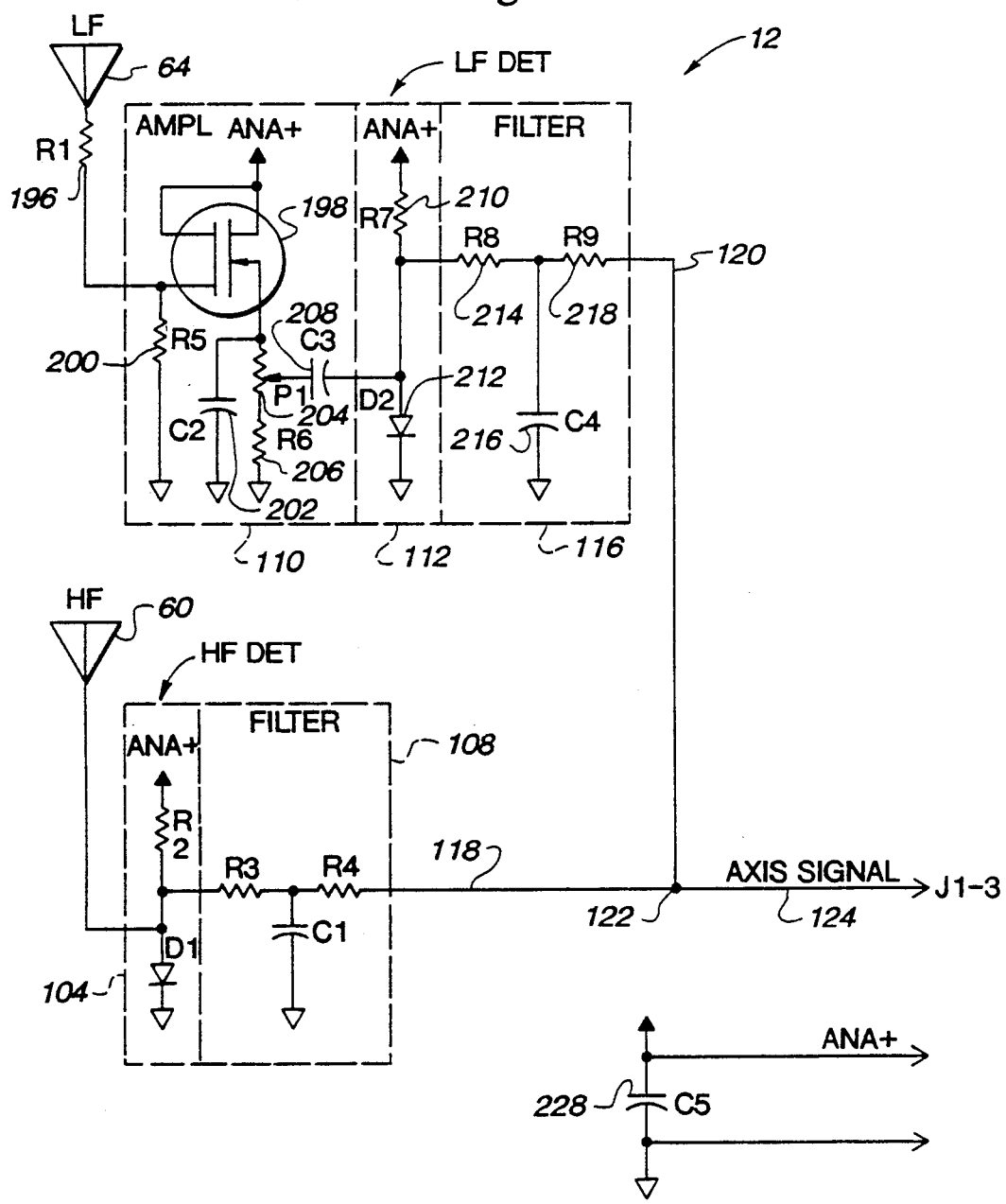
FIG. 7 is a detailed electrical schematic of the antenna subsystem.

Referring now more particularly to FIG. 6, a more detailed block diagram of the power supply and communication interface 38 may be seen. A switched power supply 182 receives power from battery 184 when manual on-off switch 186 is closed. Battery 184 preferably provides 9 volt power which is able to be switched on and off at switched power supply line 46 by power supply 182. Line 46 supplies power to a digital power supply 188 and an analog power supply 190. Separate supplies 188, 190 are provided to eliminate noise which customarily appears on a digital power supply output in the operation of digital electronics thus avoiding interference with the analog electronics in the antenna and analog subsystems 12, 24. Digital supply 188 provides the digital power 50 while analog supply 190 provides analog power 48. A battery sense circuit 192 monitors the level of switched power 46 and provides the BATTERY SENSE signal 56. A digital sense circuit 194 monitors the level of digital power 50 and provides the DIGITAL SENSE signal 58.

Referring now more particularly to FIGS. 7-11, detailed electrical schematics of the various subsystems may be seen. Referring most particularly to FIG. 7, it is again to be understood that for an isotropic version of system 10, three antenna subsystems 12 will be utilized. Antenna 64 is connected to amplifier 110, preferably through a 220K ohm resistor 196. This resistor has been found to damp resonance which otherwise may occur as a result of interaction between antennas 60 and 64, and associated circuitry. Amplifier 110 includes a 3N209 FET transistor, connected as a single-stage source follower with a 10 MEG ohm input shunt resistance 200 and a 0.033 mf capacitor 202 connected in parallel with a series connection of a 1K potentiometer 204 and a 470 ohm resistor 206 in the output circuit of FET 198. A 0.39 mf capacitor 208 is connected in series with potentiometer 204 to couple an output signal from amplifier 110 to detector 112. Detector 112 is made up of a 100K resistor 210 and a QSCH1934 diode 212, available from Hewlett-Packard. Diode 212 is a low barrier Schottky barrier diode available in matched batches, and the corresponding diodes in detector 104 and bias reference circuit 126 are to be understood to be batch-matched with diode 212 to provide for matched temperature and threshold characteristics.

Filter 116 is preferably a T filter formed of a 470K resistor 214, a 0.001 mf capacitor 216, and a 470K resistor 218.

Since antenna 60 provides more output than antenna 64, no amplifier is needed between antenna 60 and detector 104 for the high frequency antenna circuit. Detector 104 is preferably the same as detector 112, and filter 108 is also preferably the same as filter 116.

It is to be further understood that appropriate noise suppression is to be included in this subsystem, such as, for example, a 0.1 mf capacitor 228 connected across the power supply.

Figure 8:
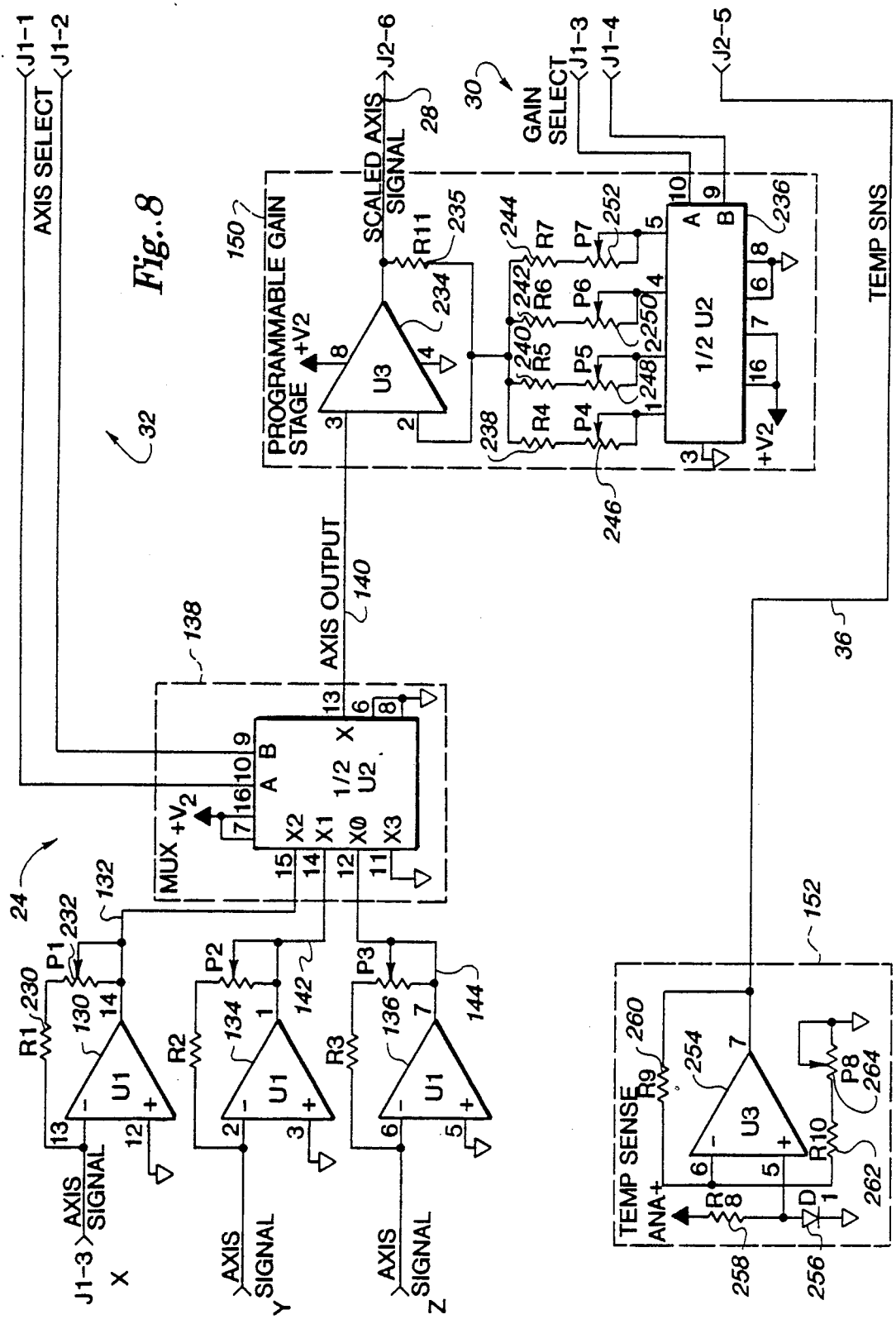
FIG. 8 is a detailed electrical schematic of the analog subsystem.

Referring now more particularly to FIG. 8, amplifier 130 has a 2.2 MEG resistor 230 connected in series with a 500K potentiometer 232 in its feedback path. Amplifiers 134 and 136 have the same values for their feedback networks. Amplifiers 130, 134 and 136 are preferably formed of a quad operational amplifier integrated circuit model number TLC27L4, available from Texas Instruments.

Multiplexer 138 is preferably one-half of a dual 4 to 1 analog multiplexer, model 74HC4052, as available from, for example, Signetics.

Programmable gain stage 150 has an operational amplifier 234 connected with a resistive feedback network made up of a 2.2 meg resistor 235 connected to one of a plurality of resistor networks controlled by multiplexer 236, which is also preferably one-half of a 4052 type integrated circuit. It is to be understood, however, that separate integrated circuits must be used for multiplexers 138 and 236 because only one pair of select lines is available (at pins 9 and 10) on each chip. Resistors 238, 240, 242, 244, are respectively, each 22K, 100K, 1 meg and 220K and potentiometers 246, 248, 250, 252 are respectively each 50K, 200K, 500K and 500K. In operation, GAIN SELECT lines 30 connected to pins 9 and 10 on multiplexer 236 will connect one of pins 1, 2, 4 or 5 to pin 3, as commanded by the microcontroller 162 in the digital subsystem 26 (see FIG. 9). Each state of pins 9 and 10 will activate a different feedback network circuit by connecting it to circuit common. For example one gain is selected by connecting potentiometer 246 and resistor 238 to circuit common at pin 3 of multiplexer 236, thus controlling the gain of operational amplifier 234.

In an alternative embodiment, multiplexers 138 and 236 may each be a 4051 type 8 to 1 analog multiplexer. In such an alternative embodiment it is to be understood that there are three SELECT lines for each of the axis 32 and gain 30 functions. It is to be further understood that an eight input wide multiplexer 138 is preferably used with six input buffer amplifiers similar to amplifier 130 and its associated circuitry. In this embodiment separate high and low frequency axis signals are brought to multiplexer 138; the analog summing junction 122 for each axis is omitted; summing or signal processing of the high and low frequency field information is performed digitally, and an eight-wide multiplexer 236, along with four additional resistor-potentiometer networks (not shown) provide additional resolution in the programmable gain stage 150.

The temperature sense circuit 152 includes an operational amplifier 254, which together with op amp 234 is preferably formed of a TLC27L2 dual op amp available from Texas Instruments. Amplifier 254 magnifies the temperature change characteristics in the forward drop of diode 256. Diode 256 is forward biased by a 100K resistor 258, a 1 MEG feedback resistor 260 and a 47K resistor 262 in series with a 100K potentiometer 264 complete temperature sensing circuit 152.

Figure 9:
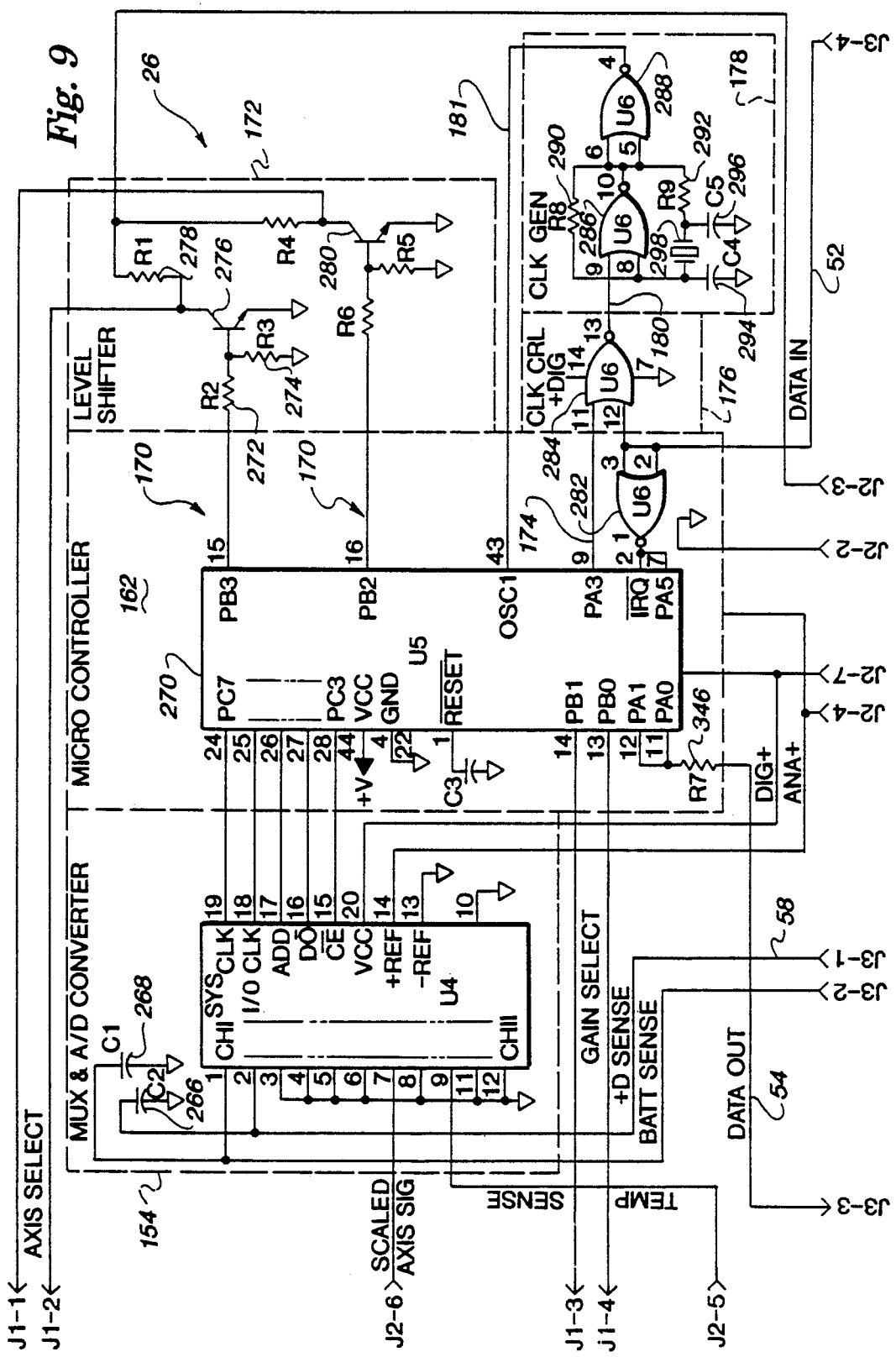
FIG. 9 is a detailed electrical schematic of the digital subsystem.

Referring now more particularly to FIG. 9, multiplexer and A to D converter 154 is preferably made up of a model TLC1541 integrated circuit available from Texas Instruments. Battery sense signal 56 and digital sense signal 58 preferably have 0.1 mf filter capacitors 266, 268 connected thereto for noise suppresion.

Figure 14:
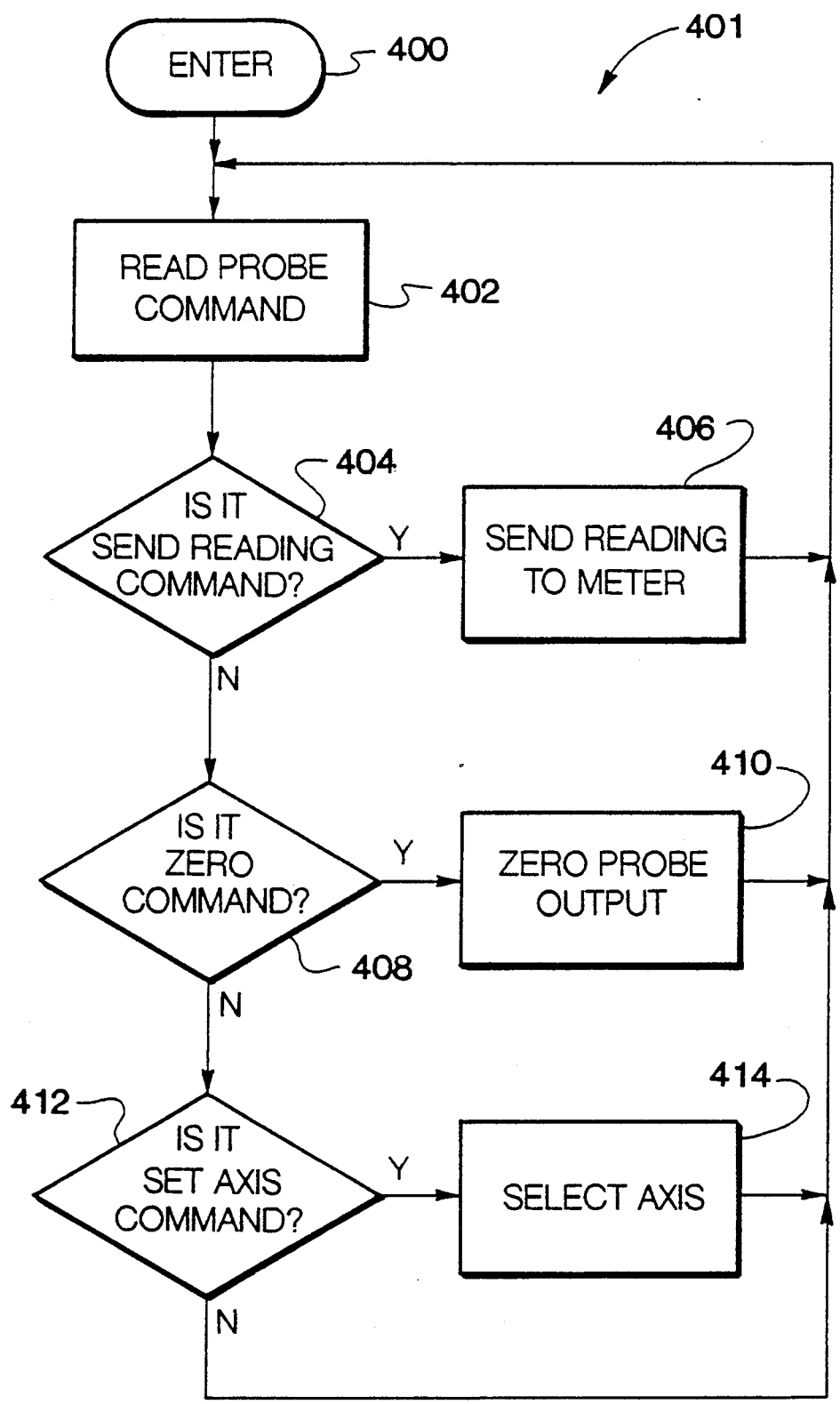
FIG. 14 is a flow chart for the main line program of the probe.

Microcontroller 162 preferably utilizes a MC68HC805C4 microcontroller 270 as available from Motorola. Referring now also to FIG. 14, the operation of microcontroller 270 is as follows. Control is entered at main entry 400. A received command is read at block 402. The read probe command 402 is shown in more detail in FIG. 15. If the read probe command is a SEND READING command, as tested by block 404, the probe will send a reading to the meter, indicated by block 406, and further detailed in FIG. 16. If the probe command is not a SEND READING command, it is tested to see if it is a ZERO command at block 408. If it is, the probe output is zeroed at block 410, the details of which are illustrated further in FIG. 17.

If the probe command is not a ZERO command, it is tested at block 412 to determine if it is a SET AXIS command. If it is, the axis is selected via the routine disclosed in more detail in FIG. 18.

Figure 15:
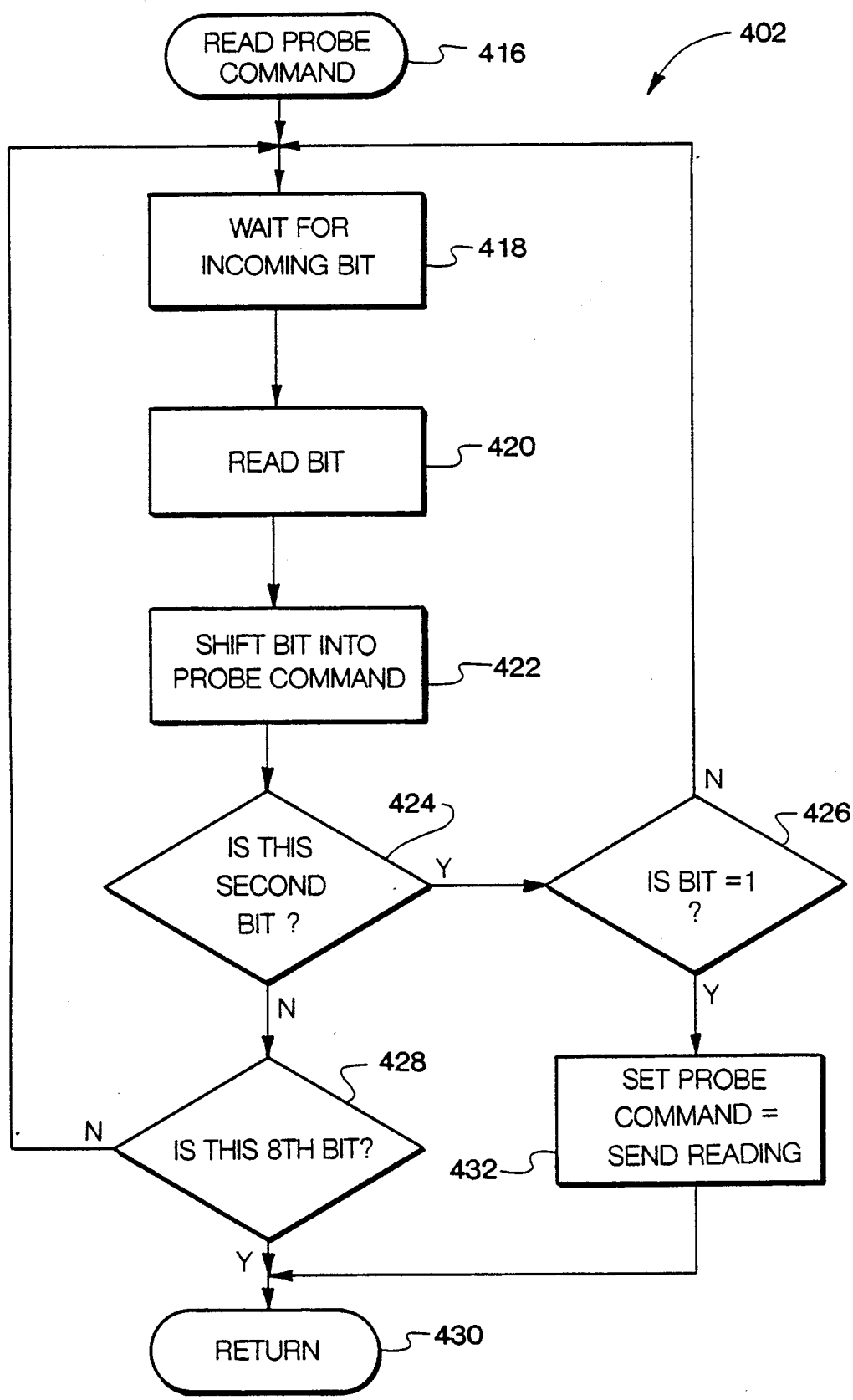
FIG. 15 is a flow chart for the READ PROBE command of FIG. 14.

Referring now more particularly to FIG. 15, the read probe command 402 may be seen in more detail. Control is entered at entry block 416. Microcontroller 270 waits for an incoming bit at block 418. In a preferred embodiment, at least a portion of the internal operations of microcontroller 270 are shut down while waiting for an incoming bit to save on battery power in the probe. An incoming bit will cause an interrupt request, which may be seen in FIG. 9 where the data-in line 52 is inverted by gate 282 and provides an input to the interrupt request pin 2 and data port PA5 at pin 7.

Once an interrupt request is generated, microcontroller 270 will read the bit at block 420 and shift the bit into the probe command format at block 422. The probe command format is either two bits long, or eight bits long, depending upon whether the second bit is a one or a zero. The bit is tested first to determine if it is the second bit at block 424, and if so, whether it is a one or a zero at block 426. If the bit is not a second bit, it is tested to determine whether it is the eighth bit at block 428 and if not, the testing continues. If it is the eighth bit, control leaves routine 402 at exit 430 and returns to main program 401 of FIG. 14. If the second bit is tested and found to be a one, this is an indication to the probe to send data and the probe command is set equal to SEND READING at block 432.

Figure 16:
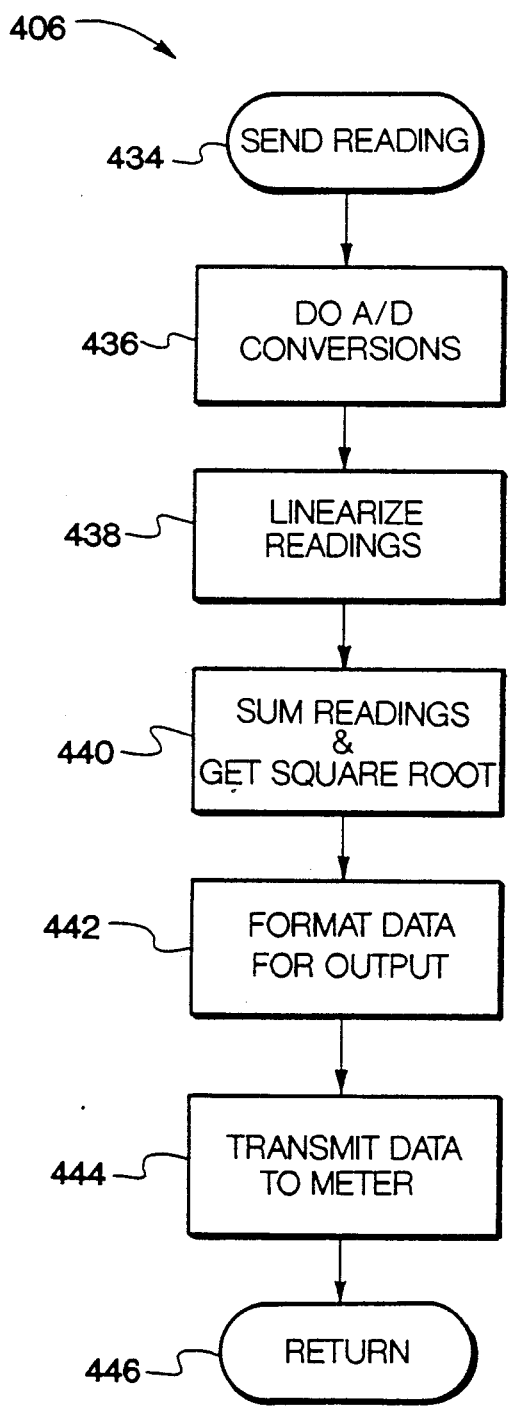
FIG. 16 is a flow chart for the SEND READING TO METER block of FIG. 14.

Referring now more particularly to FIG. 16, the SEND READING routine 406 is entered at block 434. The first task is to perform analog-to-digital conversions at block 436. The readings are then linearized at block 438, preferably by a look-up table to correct principally for non-linearity in the detector 114, 112 used in antenna subsystem 12. The readings are summed and the square root taken at block 440. The data is formatted for output from the probe to the meter at block 442 and is transmitted at block 444. Control is returned via block 446 to main program 401. In a preferred embodiment, the format for sending data is as follows: bits 0–3 are a check sum; bits 4–7 are the higher four bits of the RF value; bits 8–15 are the lower eight bits of a 12 bit RF value; bits 16–17 are the range setting; bits 18 and 19 are a partial battery voltage; bits 20 and 21 are a partial temperature value; and bit 22 is a synchronization bit for the temperature/battery information; and finally, bit 23 is a start bit.

Figure 17:
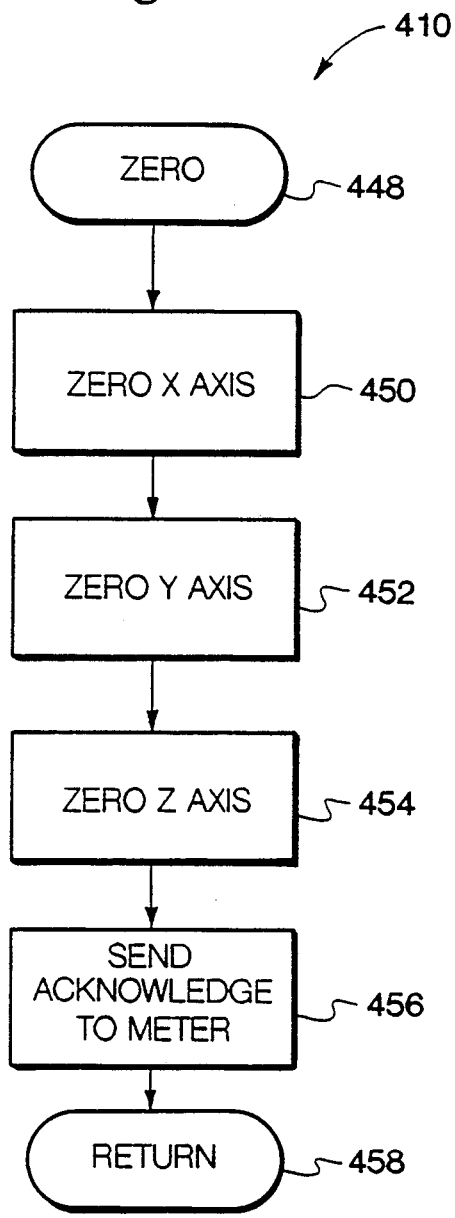
FIG. 17 is a flow chart of the ZERO PROBE output block of FIG. 14.

Referring now also to FIG. 17, when a ZERO command is sensed at block 408 in FIG. 14, the routine 410 is entered at block 448. The X, Y and Z axes are zeroed at blocks 450, 452 and 454, respectively. Preferably, in practice, the ambient field measurement is recorded during the execution of blocks 450–454 as the "zero" or reference level for succeeding measurements. An acknowledgement is returned to the meter at block 456 that the zero axes command routine 410 has been executed and control is returned at block 458 to main program 401.

Figure 18:
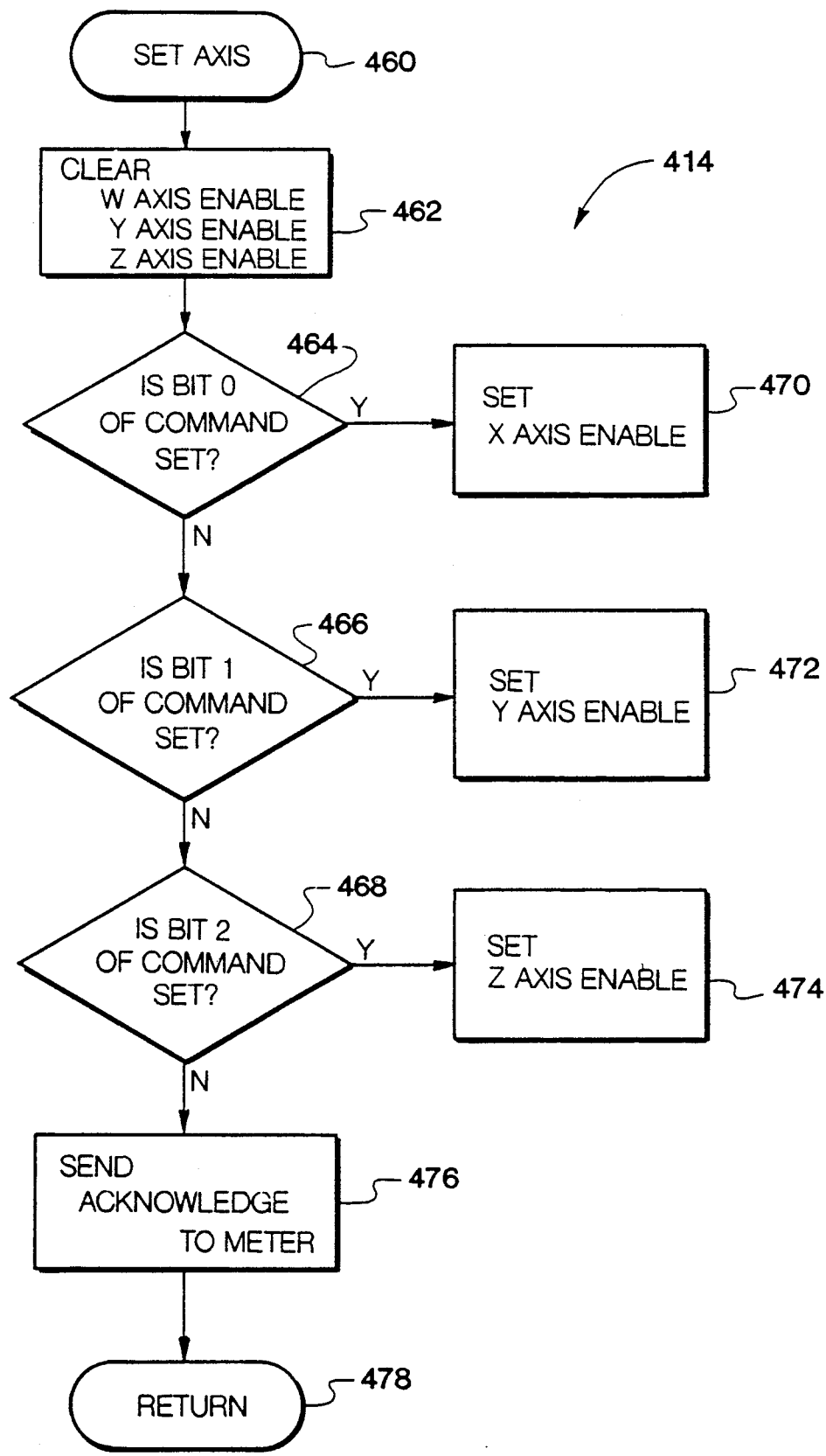
FIG. 18 is a detailed flow chart of the SELECT AXIS block of FIG. 14.

Referring now also to FIG. 18, if a SET AXIS command is detected at block 412, SET AXIS routine 414 is entered at block 460. The X, Y and Z axis enable flags are cleared at block 462. The command is then tested at bits 0, 1 and 2 in blocks 464, 466, and 468 respectively, to determine which axis to enable. The corresponding axis have their enable flags set at blocks 470, 472 and 474 respectively, in response to the respective values of bits 0–2. For example, if bit 0 is not set, bit 1 is set, and bit 2 is not set, the Y axis enable flag would be set, but neither the X nor the Z axis enable flags would be set. An acknowledgement will be sent to the meter at block 476 before returning at block 478 to the main program 401.

The acknowledgement of blocks 456 and 476 will be in the following format: bits 0–3 are a check sum; bits 4–7 are always 0; bits 8–15 will contain the command value; bits 16–22 will always be 0; and bit 23 will be a start bit.

Referring now again to FIG. 9, microcontroller 270 drives level shifter 172 through lines 170 connected to a 100K resistor 272 and a 100K resistor 274. Transistor 276 is preferably a 2N4400 type switching transistor having a 100K collector resistor 278. Preferably, the circuit for transistor 280 is identical to that for transistor 276. Level shifter 172 increases the voltage switched at the output of integrated circuit 270 which is typically between 0 and +5 volts to levels of 0 and +9 volts, for compatibility with multiplexer 138 which operates from the switched supply, which is preferably +9 volts. DATA-IN signal 52 is preferably inverted by gate 282 and then connected to the IRQ input of IC 270. Gate 284 receives DATA-IN signal 52 at one input and provides on-off control signal 180 in response to command signal 174 from microcontroller 270. Clock generator 178 utilizes a pair of NOR gates 286, 288 connected in an oscillator circuit having a 1 MEG resistor 290, a 2.2K ohm resistor 292, a 22 pf capacitor 294, a 100 pf capacitor 296, and a crystal 298. Crystal 298 is preferably a 3.58 MHz crystal such as is offered for colorburst television applications. Gates 282, 284, 286, and 288 are preferably formed of a 4001 type quad NOR gate.

Figure 10:
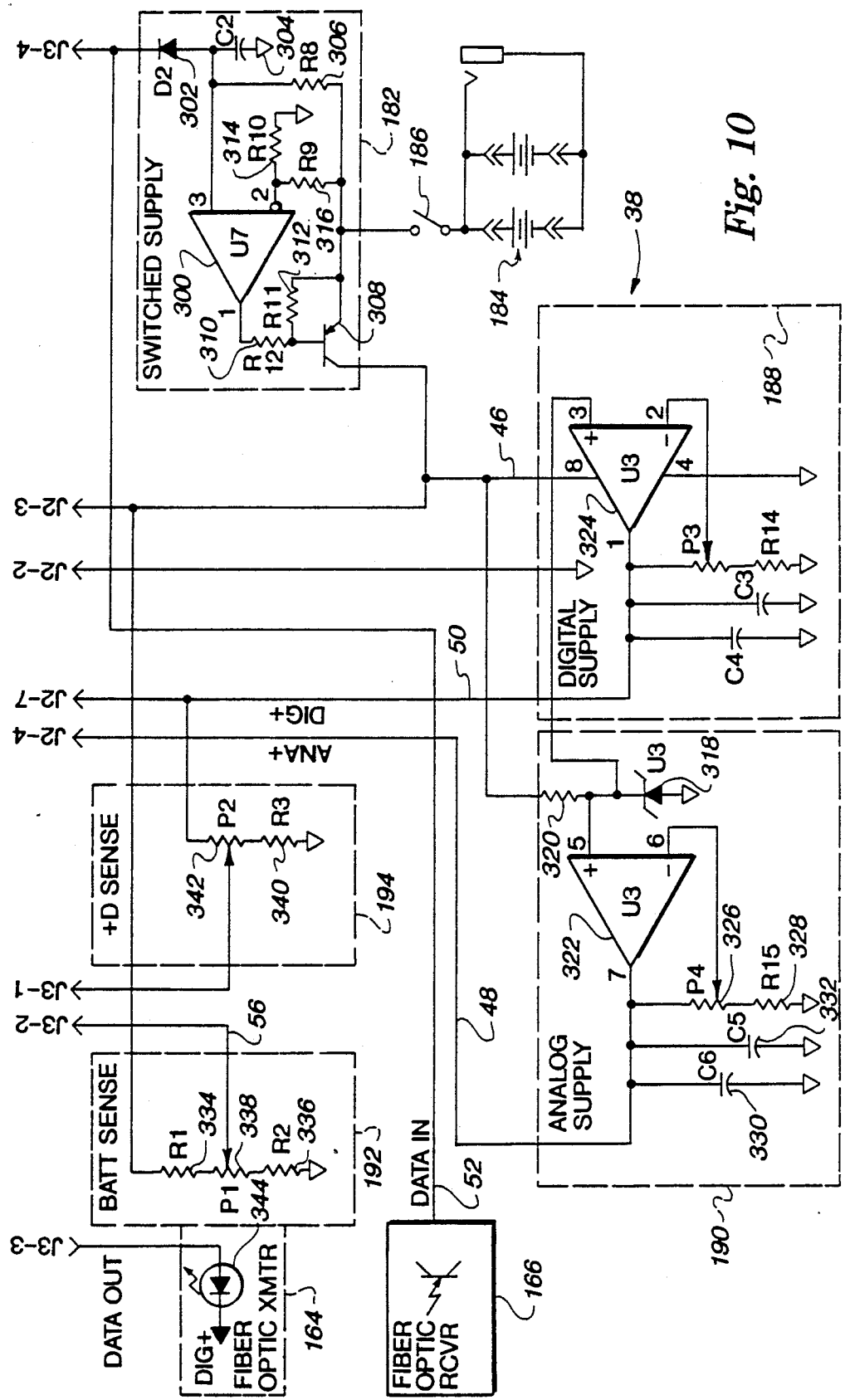
FIG. 10 is a detailed electrical schematic of the power supply and communication interface.

Referring now to FIG. 10, switched supply 182 preferably utilizes a type TLC372 operational amplifier 300, as available from Texas Instruments. The DATA-IN signal 52 is provided through a diode 302. A 2.2 mf capacitor 304 will be discharged each time a DATA-IN signal is present. A 1 MEG resistor 306 will charge capacitor 304 in the absence of any DATA-IN signal 52. After approximately one second, operational amplifier 300 will switch a transistor 308, preferably a 2N2907 type, through a 47K resistor 310 shutting off the switched power supply 46. A 100K base return resistor 312 and 100K biasing resistors 314, 316 complete the switched power supply circuit 182. Digital supply 188 and analog supply 190 utilize a precision ZENER diode 318 which is preferably rated at 1.23 volts and may be a type ICL8069BCZQ2 available from Intersil Corp., powered by a 100K resistor 320. Operational amplifiers 322 and 324 are preferably formed of a TLC 27L2 dual operational amplifier circuit available from Texas Instruments. A 39K potentiometer 326 is connected in series with a 100K resistor 328 to provide for an adjustable output voltage, which is preferably set at +5 volts. A 0.1 mf capacitor 330 and a 10 mf capacitor 332 are preferably included for noise suppression.

The battery sense circuit 192 is preferably formed of a pair of 47K resistors 334, 336 and a 100K potentiometer 338. The DIGITAL SENSE circuit 194 is preferably formed of a 100K resistor 340 and a 100K potentiometer 342.

Fiber optic transmitter is preferably a Hewlett-Packard type HLMP 4100 light emitting diode 344 connected in series with a 830 ohm resistor 346 (shown in FIG. 9).

Figure 11:
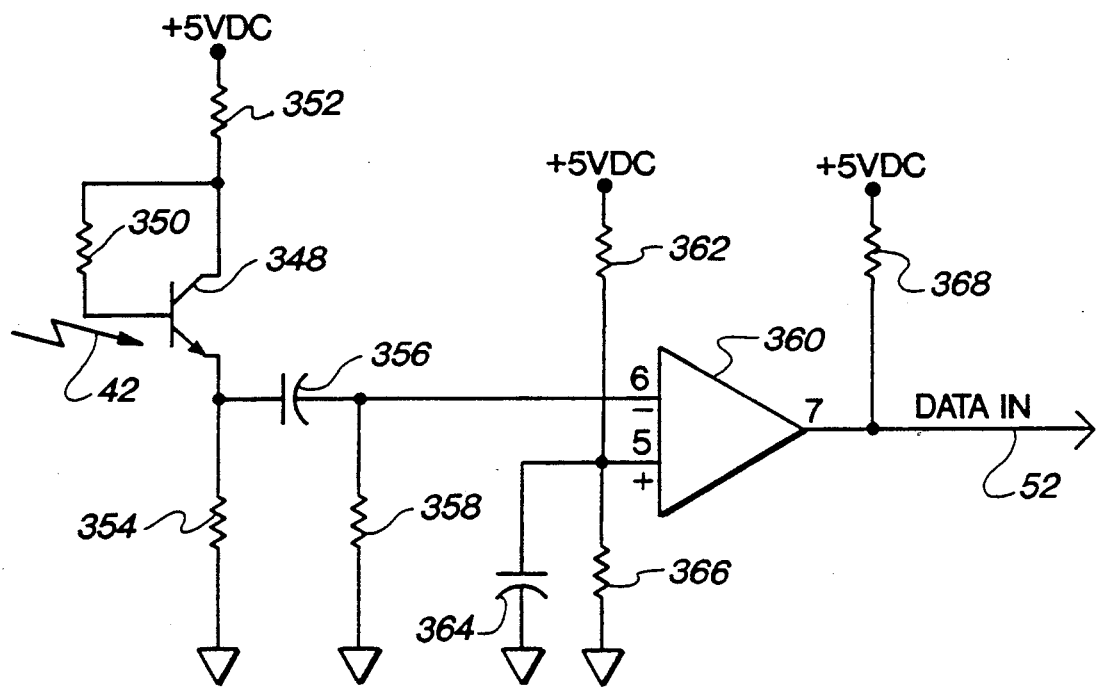
FIG. 11 is a detailed electrical schematic of the fiber optic receiver of FIG. 10.

Referring now to FIG. 11, fiber optic receiver 166 preferably utilizes a Motorola type MRD3056 fiber optic receiver transistor 348. Op amp 360 is preferably a TLC372 type available from Texas Instruments. A 1MEG biasing resistor 358 is connected to op amp 360 as are a 100K resistor 362 and a 2.2K resistor 366. A 0.01 mf capacitor 356 is also connected in the circuit between op amp 360 and transistor 348. A 100K pullup resistor 368 is connected at the output of op amp 360.

The operation of fiber optic receiver 166 is as follows. Transistor 348 is slightly positively biased by a 2.2 meg resistor 350 in the base circuit of transistor 348 and a 10K collector resistor 352. When light 42 impinges upon transistor 348, it is forward biased, causing current to flow through a 2.2K emitter resistor 354. In practice, light 42 appears in a series of pulses which are converted by transistor 348 to voltage pulses across resistor 354. Capacitor 356 couples these voltage pulses to op amp 360. Op amp 360 is connected as a comparator. The pulses coupled by capacitor 356 are presented to the inverting input of comparator 360 across resistor 358. A biasing point is presented to the non-inverting input of comparator 360, formed of a 100K resistor 362 and a 2.2K resistor 366 with noise filtering provided by a 0.01 mf capacitor 364. The output of comparator 360 is pulled up by a 100K resistor 368 connected to the DATA IN line 52. In the quiescent state, resistor 368 holds the DATA IN line high; when an optical pulse 42 is received, comparator 360 pulls the DATA IN line 52 low for the duration of the pulse 42.

Figure 12:
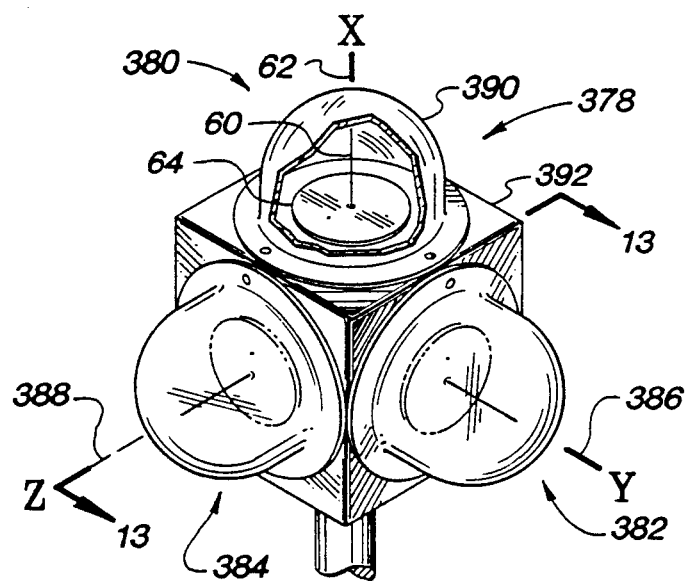
FIG. 12 is a perspective view showing mechanical details of the apparatus of the present invention.

Referring now more particularly to FIG. 12, a perspective view of a mechanical assembly useful in the practice of an isotropic embodiment of the present invention may be seen. In this view, a RF head 378 has a plurality of wide band antenna systems 380, 382, 384 each having a principal axis 62, 386, 388, respectively, with each principal axis positioned orthogonally to the principal axis of each other's antenna system. Each system 380, 382, 384 includes a displacement current antenna 64, for sensing a relatively low frequency portion of a surrounding electric field and providing a first signal representative thereof, and an associated monopole antenna 60 for sensing a relatively high frequency portion of the surrounding electric field and for providing a second signal representative thereof. It may be observed that the displacement current antenna 64 and its associated monopole antenna 60 are located adjacent each other such that the displacement current antenna 64 and its associated monopole antenna 60 will sense a same spatial component (X) of the surrounding electric field. System 382 will sense the Y spatial component and system 384 will sense the Z axis spatial component of the surrounding electric field. Head 378 preferably has a plurality of domes 390 transparent to electric field energy. Enclosure 392 is preferably formed of material impervious to electric field energy. A suitable dome material is polystyrene, while a suitable enclosure material is aluminum.

Figure 13:
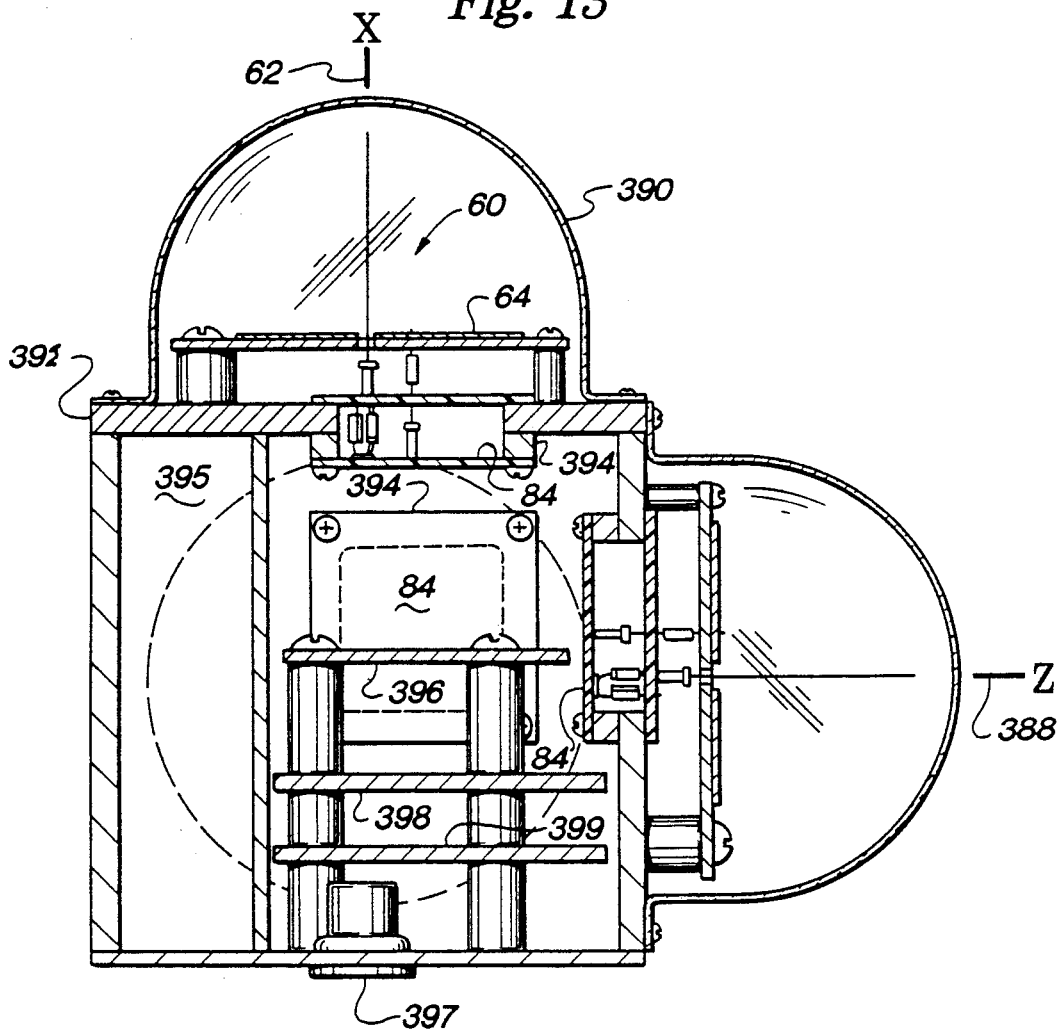
FIG. 13 is a section view along line 13 of FIG. 12.

Referring now also to FIG. 13, interior of enclosure 392 is preferably sealed against RF (radio frequency) energy. Each antenna subsystem preferably has a sub-wall 394, which together with ground plane 84 close off the interior of enclosure 392 to radio frequency electric field energy. Additional printed circuit boards 396, 398, 399 preferably form the analog, digital and power supply and communications interface subsystems, respectively. Compartment 395 may be provided to house batteries 184 (see FIG. 6). One or more suitable fiber optics connectors 397 are preferably provided to couple fiber optic signals 40, 42 to the fiber optic transmitter and receiver circuits 164, 166. It is to be understood that other suitable conventional components may be provided, such as a mechanical on-off switch (not shown) corresponding to switch 186 may be provided on the exterior of enclosure 392.

Calibration of system 10 may be accomplished by placing RF head 378 in a known high frequency field, preferably at or about 5 MHz and adjusting potentiometers 232 until each output signal 132, 142 and 144 are of equal amplitude. The frequency should then be changed to approximately 50 to 100 KHz with the same field strength and potentiometer 204 is adjusted to provide the same indication (at remote system 44) as the indication for the high frequency electric field strength.

Referring now to FIG. 8, potentiometers 246-252 are individually adjusted while system 10 is exposed to a known field strength, in order to obtain the proper full scale reading. In one embodiment, four ranges are desired for operation with the first range preferably being between 0 to 10 volts/meter, the second range being 0 to 30 volts/meter, the third range being 0 to 100 volts/meter, and the fourth range being 0 to 300 volts/meter. It is to be understood that the gain select lines 30 must be sequenced in order to adjust potentiometers 246-252, and that other ranges may be readily calibrated.

Referring now more particularly to FIG. 10, potentiometer 338 is adjusted to provide the desired trip level for low battery conditions and potentiometer 342 is adjusted to provide the desired trip point to indicate malfunction of the digital power supply circuit 188.

The invention is not to be taken as limited to all of the details thereof as modifications and variations thereof may be made without departing from the spirit or scope of the invention.

What is claimed is:

1. Apparatus for detection of electric fields over a broadband frequency range comprising:
    a) monopole antenna means having a principal axis for receiving electro-magnetic energy in a relatively high frequency band; and
    b) displacement current antenna means located concentric with the monopole antenna means for receiving electro-magnetic energy in a relatively low frequency band; and
wherein the monopole antenna means comprises a conductive portion extending from a fixed end of the monopole antenna and stopping at a mediate region thereof and a resistive portion extending axially beyond the conductive portion from the mediate region to a free end thereof and wherein the resistive portion provides an antenna resistance in addition to a radiation resistance the monopole antenna would have in the absence of the resistive portion.

2. The apparatus of claim 1 further comprising detector means for detecting the electro-magnetic energy received by each of the monopole and displacement current antenna means.

3. The apparatus of claim 2 wherein the detector means further comprises a separate detector for each of the monopole and displacement current antenna means.

4. Apparatus for isotropic measurement of wide frequency electric fields comprising:
    a) a first, second and third wideband antenna system each system having respectively first, second and third principal axes positioned orthogonally to each other and wherein each system includes:
        i) a displacement current antenna for sensing a relatively low frequency portion of a surrounding electric field, and providing a first signal representative thereof, and
        ii) an associated monopole antenna positioned along the respective principal axis of that system for sensing a relatively high frequency portion of the surrounding electric field and for providing a second signal representative thereof, wherein the monopole antenna has a free end and a fixed end and further has a resistive portion extending from the free end thereof toward a region intermediate the free and fixed ends thereof, and wherein the displacement current antenna is positioned coaxial to its associated monopole antenna such that the displacement current antenna and its associated monopole antenna will sense a same spatial component of the surrounding electric field.

5. The apparatus of claim 4 further comprising antenna subsystem means for:
    i) combining the first and second signals from each associated monopole and displacement current antenna pair, and for
    ii) providing an axis signal from each of the antenna systems.

6. The apparatus of claim 5 further comprising signal processing means for processing the axis signal from each antenna subsystem and for providing a digital representation of each axis signal representative of the surrounding electric field 7. The apparatus of claim 6 wherein the signal processing means further comprises:

a) an analog subsystem means connected to the antenna subsystem means for multiplexing and scaling the axis signals; and b) a digital subsystem means connected to the analog subsystem means for digitizing the axis signals.

8. The apparatus of claim 6 wherein the signal processing means further comprises self-checking means for sensing operation of the signal processing means and for providing an indication of normal and abnormal operation conditions.

9. The apparatus of claim 8 wherein the self-checking means further comprises a battery sensing circuit for checking the condition of a battery internal to the signal processing means.

10. The apparatus of claim 8 wherein the signal processing means further comprises a digital power supply and the self-checking means further comprises a digital sensing circuit for checking the condition of the digital power supply.

11. The apparatus of claim 8 wherein the self-checking means further comprises a temperature sensing circuit for providing an indication of temperature.

12. A dual antenna apparatus for measuring electric fields over a wide frequency band comprising:

a) a disk antenna having a central aperture and a disk principal axis perpendicular to the disk antenna;

b) a monopole antenna projecting along the disk principal axis and through the central aperture of the disk antenna; and c) separate detector means for each of the disk antenna and monopole antenna for producing an electrical output that is a measure of a common ambient electric field;

such that the disk antenna and monopole antenna are both subject to the common ambient electric field with the disk antenna transducing lower frequency components of the ambient electric field and the monopole antenna transducing higher frequency components of the ambient electric field.

13. The apparatus of claim 12 further comprising combining means for combining the electrical output of the separate detectors into a single signal representative of the electric field incident on the disk and monopole antennas.

14. The apparatus of claim 13 further comprising a programmable gain amplifier connected in series with the combining means to provide an amplified signal output.

15. The apparatus of claim 14 further comprising digital conversion means for converting the amplified signal output into a digital format.

16. The apparatus of claim 12 wherein the disk antenna and monopole antenna comprise a first antenna pair and the apparatus further comprises a second and a third antenna pair substantially the same as the first antenna pair wherein each antenna pair is positively mounted such that its principal axis is in a perpendicular relationship with the principal axis of both other pairs of antennas.

17. An electric field measurement apparatus for measuring the amplitude of electric fields in a region of space comprising:

a) an electric field signal processing system having
 i) an antenna subsystem,
 ii) an analog subsystem having a programmable gain stage to select one from a plurality of scale factors for the field measurement and to provide a scaled measurement signal representative thereof, and
 iii) a micro processor-based digital subsystem having an A/D converter time multiplexed under control of a microcontroller to convert the scaled measurement signal to a digital format;

b) a remote data collection system for collecting electric field measurement data from the signal processing system; and c) a bi-directional fiber optic communications link between the signal processing system and the remote data collection system wherein the signal processing system is located in the region where the field is to be measured and the remote data collection system is removed from said region and wherein the multiplexed A/D converter further converts signals representative of: i) an ambient temperature of said region, and ii) a plurality of voltage levels of a multi-output power supply in the signal processing system.

18. The apparatus of claim 17 wherein the signal processing system further comprises a power supply and communications interface.

19. The apparatus of claim 17 wherein the antenna subsystem further comprises an antenna, a 20. The apparatus of claim 17 wherein the signal processing system further comprises a plurality of antenna subsystems oriented along mutually orthogonal axes and the analog subsystem has a multiplexer to time multiplex measurements from the antenna subsystem.

* * * * *

UNITED STATES PATENT AND TRADEMARK OFFICE
CERTIFICATE OF CORRECTION

PATENT NO. : 5,057,848

DATED : October 15, 1991

INVENTOR(S) : William J. Rankin et al.

It is certified that error appears in the above-identified patent and that said Letters Patent is hereby corrected as shown below:

Column 12, line 44

After "a" insert --radio frequency detector, and a filter.--

Signed and Sealed this

Twenty-third Day of February, 1993

Attest:

STEPHEN G. KUNIN

*Attesting Officer*   *Acting Commissioner of Patents and Trademarks*